United States Patent
Seitoh

(10) Patent No.: US 6,829,181 B1
(45) Date of Patent: Dec. 7, 2004

(54) SEMICONDUCTOR MEMORY, METHOD OF TESTING SEMICONDUCTOR MEMORY, AND METHOD OF MANUFACTURING SEMICONDUCTOR MEMORY

(75) Inventor: Akira Seitoh, Akishima (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/399,975

(22) PCT Filed: Nov. 2, 2000

(86) PCT No.: PCT/JP00/07709

§ 371 (c)(1),
(2), (4) Date: Apr. 24, 2003

(87) PCT Pub. No.: WO02/37503

PCT Pub. Date: May 10, 2002

(51) Int. Cl.[7] .............................. G11C 29/00; G11C 7/00
(52) U.S. Cl. ............. 365/201; 365/230.01; 365/230.03; 365/236; 714/718
(58) Field of Search ........................ 365/189.1, 189.07, 365/201, 230.01, 230.03, 236; 714/718, 719, 720

(56) References Cited

U.S. PATENT DOCUMENTS

| | | | | |
|---|---|---|---|---|
| 5,790,559 A | * | 8/1998 | Sato | 714/720 |
| 5,835,428 A | * | 11/1998 | Kobayashi | 365/201 |
| 6,173,238 B1 | * | 1/2001 | Fujisaki | 365/230.01 |

FOREIGN PATENT DOCUMENTS

| | | |
|---|---|---|
| JP | 6-338200 | 12/1994 |
| JP | 10-148658 | 6/1998 |
| JP | 11-96792 | 4/1999 |
| JP | 2000-123599 | 4/2000 |

* cited by examiner

Primary Examiner—Van Thu Nguyen
(74) Attorney, Agent, or Firm—Miles & Stockbridge P.C.

(57) ABSTRACT

Testing circuits each including a comparator for comparing data read from semiconductor memories to be tested with expected value data and thereby detecting coincidences/non-coincidences, and a counter for counting the number of non-coincidences detected are provided on a printed board for burn-in or within semiconductor memories to be tested. The semiconductor memories can be tested by the testing circuits respectively.

7 Claims, 12 Drawing Sheets

(A)

(B)

SEMICONDUCTOR MEMORY, METHOD OF TESTING SEMICONDUCTOR MEMORY, AND METHOD OF MANUFACTURING SEMICONDUCTOR MEMORY

TECHNICAL FIELD

The present invention relates to a semiconductor memory, a method of testing the same, and a method of manufacturing the same, and particularly to a technology effective for application to testing and manufacture of an electrically programmable and erasable nonvolatile semiconductor memory like a flash memory, and an electrically programmable and erasable nonvolatile semiconductor memory with a test circuit built therein.

BACKGROUND ART

As a method of testing a semiconductor memory, there is generally provided a method of generating test pattern data by a test device called a memory tester, inputting the test data to a memory to thereby perform its writing, next reading the written data from the memory, comparing the data with an expected value, and thereby determining the memory as defective when they do not coincide with each other.

In a volatile semiconductor memory such as a DRAM (Dynamic Random Access Memory), an SRAM (Static RAM) or the like, a so-called repair technology based on a redundant circuit system has been established in which a spare memory column or memory row is provided and when a fail bit is detected, its corresponding substitution is performed. In an electrically programmable and erasable nonvolatile semiconductor memory typified by a flash memory, contrary to the above, there is known a technology for configuring a system in such a manner that a failure address is detected by testing, and the detected non-failure/failure information is stored in a memory array and provided for a user, and the user avoids a fail bit through the use of the non-failure/failure information and makes use of a normal bit alone.

Further, in the volatile semiconductor memory such as the DRAM, SRAM or the like, there has been proposed the invention related to a semiconductor memory wherein a test circuit called an ALPG (Algorithmic Memory Pattern Generator) for generating test patterns (addresses and data) of a memory circuit in accordance with a predetermined algorithm and performing its test is mounted on a semiconductor chip equipped with the memory circuit (International Publication WO98/47152).

Such a test technology of ALPG system can be also applied to a nonvolatile semiconductor memory. Since, however, the flash memory or the like needs a mechanism for detecting the failure address by testing and storing the detected non-failure/failure information in the memory array as described above, it has been considered that the flash memory or the like encounters difficulties in providing the test circuit on the chip and performing its testing.

On the other hand, a test placed under a high temperature called a burn-in test or an aging test for detecting potential defective units in addition to a tester-based inspection at a wafer stage has been also performed upon testing of the semiconductor memories including the nonvolatile memory such as the flash memory or the like as well as the DRAM and SRAM. The burn-in test is performed while mounting several tens to several hundreds of memories each placed in a state of being assembled into a package, onto a printed board called a burn-in board, collectively inserting the board into a heating chamber in the form of several tens of sheets and applying test patterns from a control device.

The nonvolatile semiconductor memory encounters difficulties in stabilizing write and erase characteristics in the case of the present process technology. Therefore, a write and erase-repeated write/erase cycle test unexecuted upon testing of the volatile semiconductor memory such as the DRAM (Dynamic Random Access Memory), the SRAM (Static RAM) or the like, has been performed within a burn-in apparatus.

FIG. 10 shows a procedure for testing a conventional nonvolatile semiconductor memory after the assembly thereof into a package. As shown in the same drawing, memories subsequent to the completion of an assembly step of Step S1 are shifted to a burn-in step (Step S2), where they are respectively mounted onto a burn-in board and subjected to a burn-in test in normally several hundreds of units over 10 hours or so. Further, a write and erase-repeated write/erase cycle test is performed within the burn-in apparatus (Step S3). Afterwards, the procedure proceeds to a sorting or selection step (Step S4) using a memory tester, where a DC test, an AC test and a function test, etc. are performed, whereby only ones judged as non-defective are shipped.

However, the conventional test method is accompanied by a problem that since the tests using the memory tester can be performed only in a few or several tens of units, they are inefficient as compared with the burn-in apparatus capable of performing tests in several thousands of units, and since an expensive tester capable of performing the function test is required in the selection step in Step S4, the rate of a test cost taken up in a product unit price becomes so high.

Described specifically, the cost of the tester capable of performing the function test takes several tens of times as much in cost as the most expensive device with a test function, of a tester and a burn-in apparatus capable of performing a DC test and an AC test alone. Since the conventional test method makes use of such an expensive tester and can be executed only in the few or several tens of units, the number of testers is limited even if the efficiency of a manufacturing process is made high. Therefore, the time required to perform each test by the tester was brought into a bottleneck, so that production efficiency was remarkably reduced. Since the number of expensive testers must be increased to increase the number of memories testable per unit time, a problem arises in that a huge or tremendous capital investment is required.

An object of the present invention is to provide a test technology capable of testing a nonvolatile semiconductor memory without using such an expensive tester as to be capable of performing a function test.

Another object of the present invention is to provide a test technology capable of increasing the number of nonvolatile semiconductor memories capable of simultaneously performing a function test.

A further object of the present invention is to provide a test technology capable of causing a nonvolatile semiconductor memory to perform its self-test without increasing a chip size so much.

The above, other objects and novel features of the present invention will become apparent from the description of the present specification and the accompanying drawings.

DISCLOSURE OF THE INVENTION

Summaries of representative ones of the inventions disclosed in the present application will be described as follows:

A method of testing a plurality of semiconductor memories to be tested, according to the present invention, is characterized by mounting the plurality of semiconductor memories on a printed board or a test board equipped with a plurality of sockets in which the plurality of semiconductor memories are mountable, and testing circuits each including a comparator for comparing data read from the semiconductor memories with expected value data and thereby detecting coincidences/non-coincidences therebetween and a counter for counting the number of the detected non-coincidences, connecting the printed board to a connector lying within a heating chamber of a burn-in apparatus, simultaneously testing the plurality of semiconductor memories by the testing circuits while updating addresses, and counting the number of addresses at which failures are detected, by the counter and outputting the result of counting thereby.

According to the above configuration, a plurality of semiconductor memories mounted on the same board can be simultaneously tested within a burn-in apparatus by testing circuits on a printed board and the detected result of failure can be outputted. It is therefore possible to eliminate the use of such an expensive tester as to be capable of performing a function test and test a large number of semiconductor memories simultaneously. Consequently, the cost taken for testing can be lowered, and the amount of a capital investment for shorting the time required to perform testing can be reduced.

Preferably, failure information obtained by ORing a previous result of failure determination read from storing means for storing a result of failure determination based on the result of comparison by the comparator with a result of failure/non-failure determination based on the result of comparison by the comparator is stored again in the storing means. Thus, since a plurality of types of tests are continuously performed and their results can be stored in the storing means, test efficiency is enhanced. Since the failure information obtained by making ORing with the previous result of failure determination is stored in the storing means, the memory or storage capacity of the storing means for storing the failure information can be reduced and the cost of each testing circuit can be lowered.

Further, preferably, the failure information read from the storing means for storing the failure information is counted by the counter lying within each testing circuit after the completion of testing. Thereafter, dummy failure information or determining failure information is supplied to and counted by the counter, and an overflow signal outputted from the counter is monitored to make failure/non-failure determination. Consequently, a decision as to whether a product (corresponding to a semiconductor memory configured as a device to be tested) is non-defective or defective, can be simply performed by a simple test device.

Next, a semiconductor memory manufacturing method according to the present invention is characterized by mounting semiconductor memories obtained by cutting memory chips formed on a wafer and enclosing the same in packages on a printed board or a test board equipped with a plurality of sockets, and testing circuits each including a comparator for comparing data read from the semiconductor memories to be tested with expected value data and thereby detecting coincidences/non-coincidences therebetween and a counter for counting the number of the detected non-coincidences, connecting the printed board to a connector lying within a heating chamber of a burn-in apparatus, simultaneously testing the plurality of semiconductor memories by the testing circuits while updating addresses after execution of a burn-in process or while the burn-in process is being performed, thereafter taking out the printed board from within the heating chamber of the burn-in apparatus, performing, by a test device, a test other than the tests executed by the testing circuits, and selecting only the semiconductor memories judged as non-defective by the two tests.

According to the above configuration, since a plurality of semiconductor memories mounted on the same board are simultaneously tested within a burn-in apparatus by testing circuits on a printed board and the detected result of failure can be outputted, the use of such an expensive tester as to be capable of performing a function test becomes unnecessary. Further, since the time required to perform testing can be shortened owing to the execution of simultaneous testing of a large number of semiconductor memories, the manufacturing cost can be drastically reduced.

Further, a semiconductor memory according to the present invention is one configured in such a manner that a testing circuit including a comparator for comparing data read from a memory circuit to be tested with expected value data to thereby detect coincidences/non-coincidences therebetween, and a counter for counting the number of the detected non-coincidences is formed on the same semiconductor chip as one being formed with the memory circuit to be tested, the memory circuit is tested by the testing circuit while updating addresses, the number of addresses at which failures are detected, is counted by the counter, and the result of counting thereby is capable of being outputted to the outside.

According to the above configuration, the memory circuit is tested without using a high-performance tester, so that the presence or absence of each fail bit can be recognized. Thus, the cost taken for testing can be reduced, and a large number of semiconductor memories can be tested simultaneously using a burn-in apparatus or the like, whereby the time required to perform testing can be greatly shortened.

Here, preferably, a result-of-determination storage circuit for storing a result of failure determination based on a result of comparison by the comparator is formed on the same semiconductor chip as one being formed with the memory circuit to be tested, together with the testing circuit. Thus, since there is no need to store the result of testing in an external test device, the management of the test result and the process of product selection or the like based on the management can be easily performed.

Each of word lines for the result-of-determination storage circuit may be configured so as to be selected by a select signal of an address decoder for selecting each word line in a memory array of the memory circuit, and the result of failure determination based on the result of comparison by the comparator may be configured so as to be stored in the result-of-determination storage circuit in association with each memory row of the memory array to be tested. Thus, when the result-of-determination storage circuit for storing the result of failure determination is formed on one semiconductor chip together with the memory circuit and testing circuit, circuit's simplification is enabled and a substantial increase in chip size can be suppressed.

Further, the result-of-determination storage circuit is provided at part of the memory circuit to be tested. Consequently, further circuit's simplification is enabled and an increase in chip size can be suppressed. Further, the result-of-determination storage circuit can be built in a chip without any need to add a new step in a process.

Preferably, information obtained by ORing a previous result of failure determination read from the result-ofdetermination storage circuit with a result of failure/non-failure determination based on the result of comparison by the comparator is configured so as to be stored in the result-of-determination storage circuit. Thus, even when a plurality of types of tests are performed, the memory capacity of the result-of-determination storage circuit for storing their results therein needs not to increase. It is therefore possible to realize a semiconductor memory high in reliability and small in chip size.

Further, preferably, the counter for counting the number of failure addresses is configured so as to count the failure information read from the result-of-determination storage circuit. Thus, since the counting of the number of failure addresses may be once even when a plurality of types of tests are performed, the time required for determination is shortened.

Further, the counter may be configured so as to count the failure information read from the result-of-determination storage circuit and output an overflow signal when the counter counts subsequently-inputted dummy failure information or determining failure information and counts the same up to a predetermined number. Thus, since there is no need to determine the number of failure addresses, and the overflow signal may simply be monitored, the burden on a test device for making a decision is less reduced.

When the memory circuit to be tested comprises nonvolatile memory elements, the result-of-determination storage circuit may be made of volatile memory elements. Since the storage circuit made of the volatile memory elements is short in write time as compared with the storage circuit comprising the nonvolatile memory elements, an increase in test time can be suppressed where the storage circuit for storing the result of determination is built in a chip.

BEST MODE FOR CARRYING OUT THE INVENTION

Preferred embodiments of the present invention will hereinafter be described based on the accompanying drawings.

Figure 1:
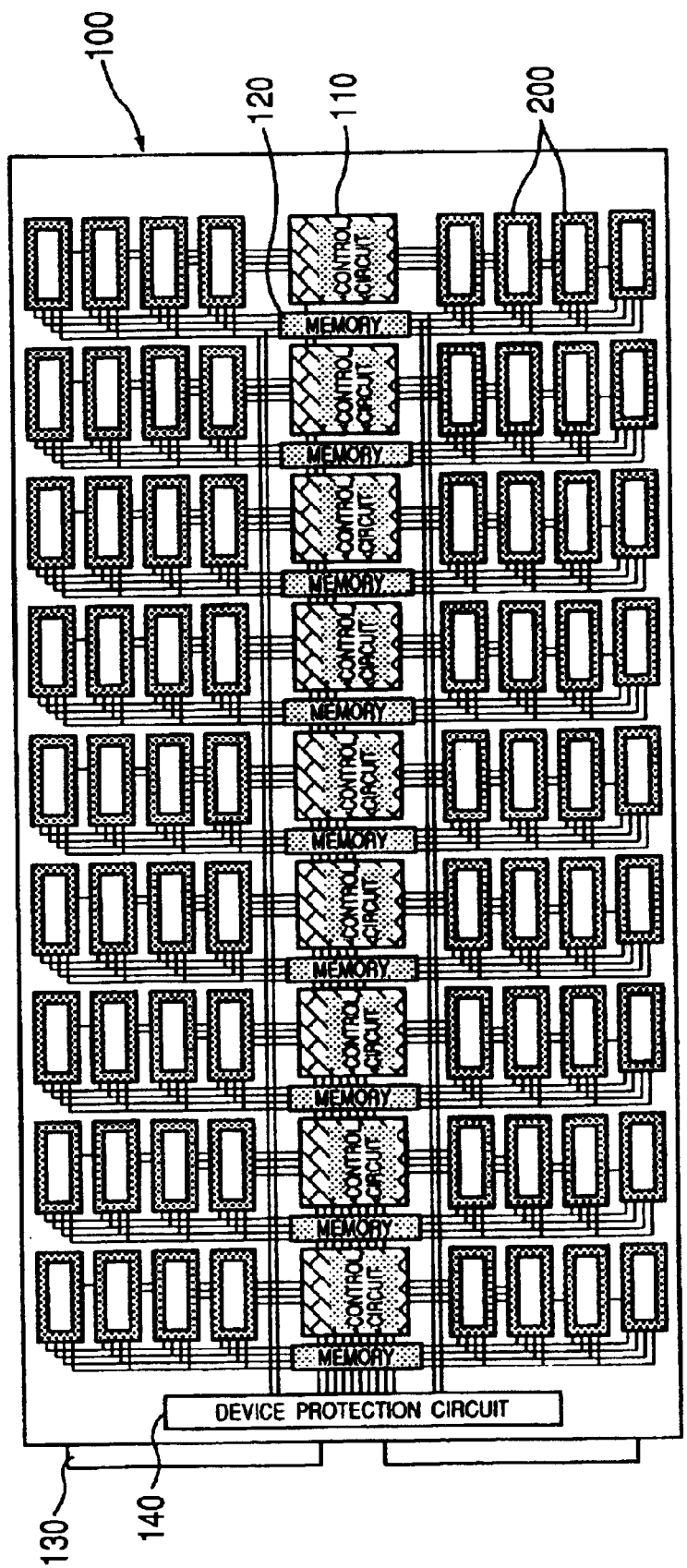
FIG. 1 is a block diagram showing a schematic configuration of a burn-in board to which the present invention is applied.

A schematic configuration of a test board used as a burn-in board for mounting a plurality of semiconductor memories thereon and inserting them in a burn-in apparatus and allowing them to be tested simultaneously, to which the present invention is applied, is shown in FIG. 1.

In FIG. 1, reference numeral 100 indicates a burn-in board comprising a printed wiring board, reference numerals 200 indicate devices to be tested, such as a flash memory used as an electrically programmable and erasable nonvolatile semiconductor memory to be tested, etc., and reference numerals 110 indicate test circuits which respectively generate signals for the tested devices 200 in response to control signals supplied from a device placed outside the board, and take in and process signals outputted from the tested devices 200.

In the burn-in board 100 according to the present embodiment as shown in FIG. 1, the test circuits 110 each brought into semiconductor integrated circuit form, and failure-address storing semiconductor memories 120 like RAMs each storing a test result are alternately disposed in the center of the board by a plural number (nine in the drawing) in a single horizontal row. The tested devices 200 are respectively disposed on both sides (upper and lower sides in the drawing) of the test circuits 110 by a predetermined number (four in the drawing).

Connection terminal rows 130 are formed at one side (left side in the drawing) of the burn-in board 100. The connection terminal rows 130 are inserted into their corresponding connectors (slots) provided within a heating chamber of the unillustrated burn-in apparatus to make it possible to transmit and receive signals between a control device on the burn-in apparatus side and each test circuit 110 on the board. Further, a device protection circuit 140 constituted of resistors, capacitors, fuses, etc. which is used to protect the tested devices 200 from a surge voltage or the like, is provided on the connection terminal rows 130 side of the burn-in board 100.

The test circuits 110 each brought into the semiconductor integrated circuit form, and the failure-address storing semiconductor memories 120 like RAMs each storing the test result respectively have external terminals directly connected onto the burn-in board 100 by solder or the like, whereas the tested devices 200 are detachably inserted and mounted in their corresponding sockets (not shown) provided on the burn-in board 100.

Along with the above, wiring patterns (not shown) for connecting corresponding terminals of eight sockets placed in a row as viewed in a vertical direction and corresponding terminals of the central test circuits 110 respectively are formed on the board. One test circuit 110 simultaneously applies the same signal to the eight tested devices 200 placed in one row. Upon reading of data, signals outputted from the eight tested devices 200 placed in one row are configured so as to collect into the corresponding center test circuit 110. Further, the same signal is simultaneously transmitted from the control device on the burn-in apparatus side even to the nine test circuits 110 placed on the board. Signals indicative of results tested on the respective tested devices 200 are configured so as to be outputted in parallel from the respective test circuits 110 to the control device on the burn-in apparatus side.

Incidentally, although not restricted in particular, on-board wirings are formed in such a manner that memory control signals such as a write control signal WE, a chip select signal CE, an output enable signal OE, etc., corresponding to part or some of the signals supplied from the control device on the external burn-in apparatus side to the burn-in board 100 are directly supplied to the tested devices 200 without via the test circuits 110.

Figure 2:
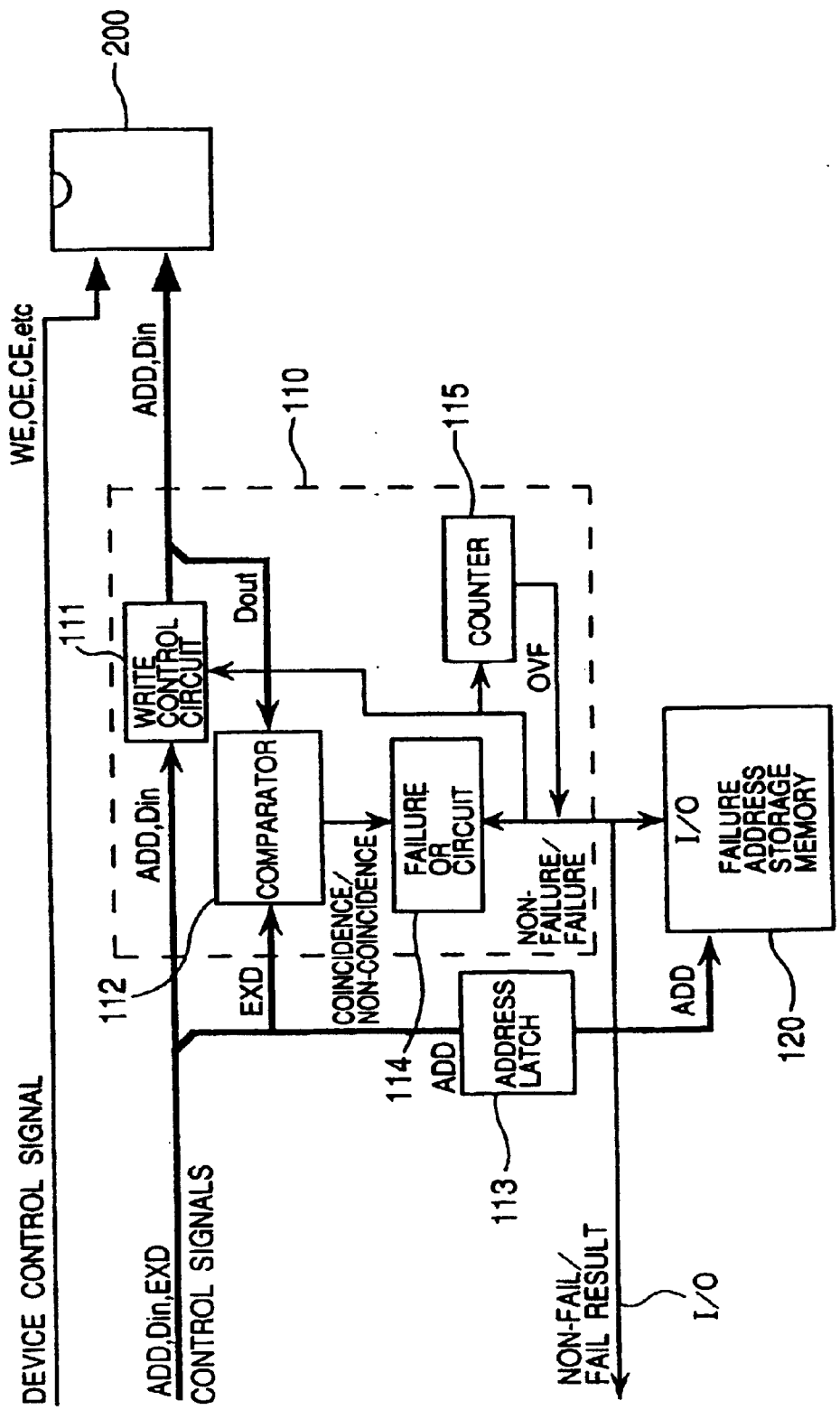
FIG. 2 is a block diagram illustrating a configuration example of a test circuit.

FIG. 2 shows a schematic configuration of one embodiment of a test circuit 110 provided on the burn-in board 100.

The test circuit 110 according to the present embodiment is configured so as to include a write control circuit 111 which outputs an address signal ADD and write data Din supplied from the control device on the burn-in apparatus side to the burn-in board 100 to the corresponding tested device 200 with timing suitable for the semiconductor memory corresponding to a device to be tested and controls the interior of the corresponding test circuit, a data comparator 112 which compares read data Dout read from the tested device 200 with an expected value EXD supplied from the control device on the burn-in apparatus side and thereby determines coincidence/non-coincidence between the two, an address latch 113 which takes in or captures address signals (word addresses) supplied from the control device on the burn-in apparatus side upon reading and retains them therein, a failure OR circuit 114 which makes ORing with the result of coincidence/non-coincidence of previous read data, and a counter 115 which counts the number of defective or failure addresses.

Incidentally, in the present embodiment, the comparison between the read data and the expected value by the comparator 112 is configured so as to be performed with sectors, i.e., memory cells connected to the same word line and placed in the same row as units. Thus, if a fail bit exists within each of the sectors even one, then the corresponding sector is regarded as a fail or bad sector. The number of failure addresses each indicative of the position of the bad sector, i.e., the number of bad sectors is counted by the counter 115.

A failure-address storage memory 120 for storing a test result comprises a memory for inputting and outputting data in 1-bit units, which has the same number of bits as the number of sectors of a flash memory of the tested device 200, or storage or memory capacity greater than or equal to it, and is configured so as to be accessed by a word address supplied from the control device on the burn-in apparatus side to the tested device 200, thereby causing the corresponding sector of the tested device 200 and the corresponding address of the failure-address storage memory 120 to correspond at a rate of 1:1.

Thus, when 1-bit information indicative of failure/non-failure of a sector corresponding to a given address of the failure address storage memory 120 is stored therein, the corresponding address of the failure address storage memory 120 in which the information indicative of "failure" has been stored, indicates an address for a bad sector in the tested device 200. Accordingly, the failure address storage memory 120 is capable of regarding a failure address of each tested device as being stored therein.

In the present embodiment, when the failure address storage memory 120 is accessed by a word address latched in the address latch 113, data expressed in its corresponding bit is read and supplied to the failure OR circuit 114, where the data and a signal indicative of the result of comparison by the comparator 112 are ORed, after which the result of ORing is written back into the same address of the failure address storage memory 120.

Further, the test circuit 110 according to the present embodiment is configured in such a manner that the number of bits corresponding to, for example, a logical "1" indicative of a failure, which have been stored in the failure address storage memory 120, is counted by the counter 115, an overflow signal OVF indicating overflowing of the counter 115 is outputted to the control device on the burn-in apparatus side via an input/output line I/O, and the supply of data (or address) from the write control circuit 111 to the tested device 200 is prohibited by the bits indicative of the failure, which have been stored in the failure address storage memory 120.

The control device on the burn-in apparatus side makes use of the counter 115 and monitors the overflow signal OVF outputted therefrom, thereby making it possible to recognize that the number of failure addresses in the corresponding tested device has exceeded an allowable number. Incidentally, the overflow signal OVF may be configured so as to be outputted to the control device on the burn-in apparatus side via the failure OR circuit 114 as will be described later. The signal indicative of the failure/non-failure outputted from the failure OR circuit 114, and the information indicative of the result of failure determination read from the failure address storage memory 120 may also be configured so as to be outputted to the control device on the burn-in apparatus side via the input/output line I/O.

Figure 3:
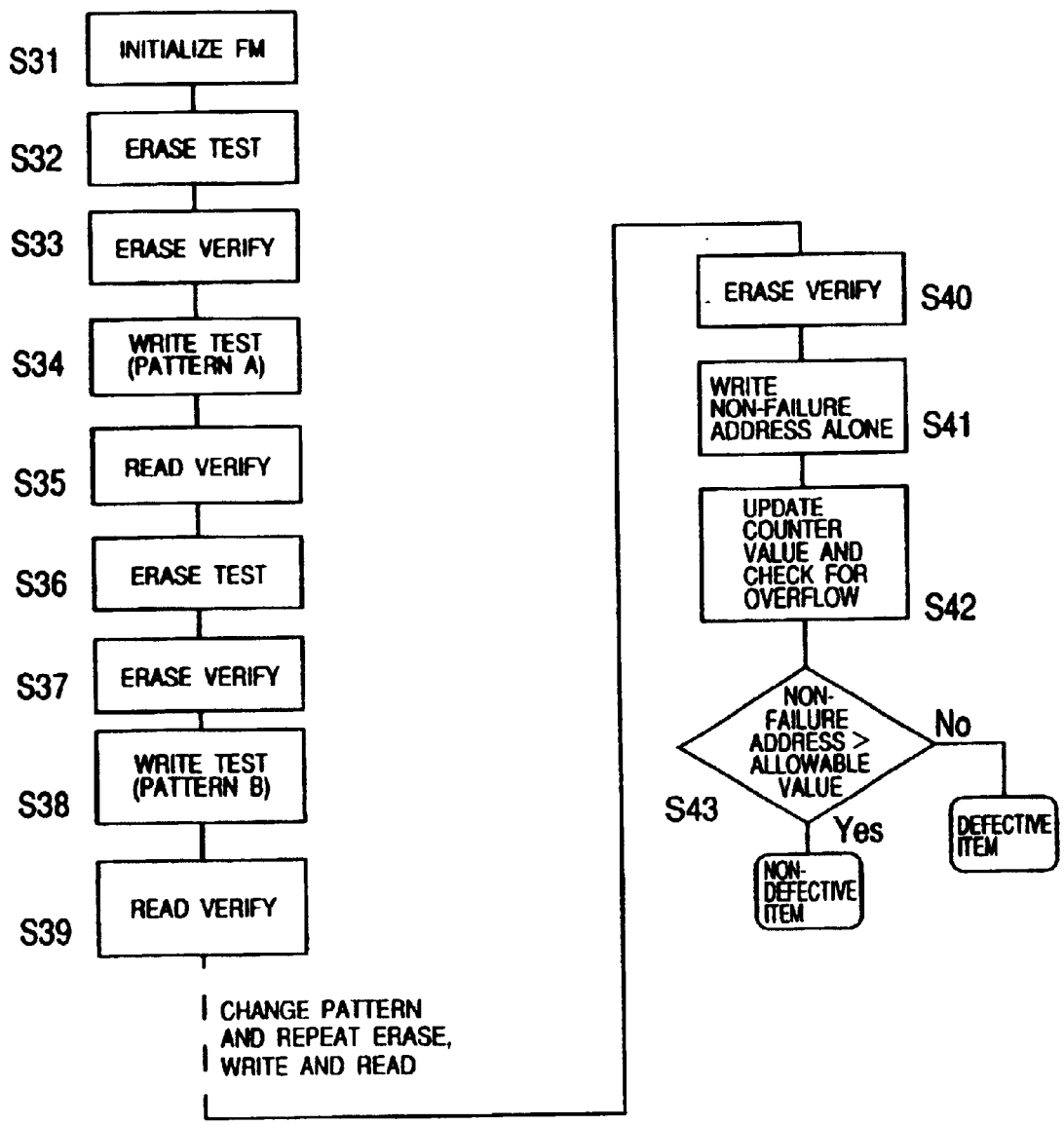
FIG. 3 is a flowchart showing a whole test procedure of a flash memory placed in the burn-in board to which the present invention is applied.

One example of a test procedure of the tested device 200, using the test circuit 110 constructed in the above-described manner will next be described using FIG. 3.

When a test is started, the failure address storage memory 120 is first initialized (Step S31). Here, the initialization means that stored data of all bits of the failure address storage memory 120 are set to a logical "0" indicative of "non-failure". When, for example, the flash memory is a device in which a command register, a status register, etc. provided thereinside need to be initialized, the tested device 200 is also initialized. This initialization can be performed by, for example, the control signals WE, CE, OE, etc. directly supplied from the control device of the burn-in apparatus to the flash memory.

When the initialization of the failure address storage memory 120 is completed, an erase test is first performed (Step S32). The erase test means that all the memory cells in the flash memory are respectively brought to an erase state (e.g., a state in which a threshold is high). With a block constituted of a predetermined number of sectors as a unit, for example, data in memory cells for all sectors in the block are simultaneously erased. After the erase operation, verify reading is performed (Step S33). The erase verify reading is carried out in sector units.

Data read by the verify operation is compared with an expected value (all "0" or all "1"). When a sector having an erase failure exists, a logical "1" indicative of "failure" is written into the corresponding address of the failure address storage memory 120. The erase state may correspond to a state in which the threshold of each memory cell is low. The logical "0" of each stored data may correspond to the erase state of the memory cell, or the logical "1" of each stored data may correspond to the erase state of the memory cell. The present embodiment will be described below on condition that the logical "0" of the stored data has been associated with the erase state of the memory cell.

Figure 4:
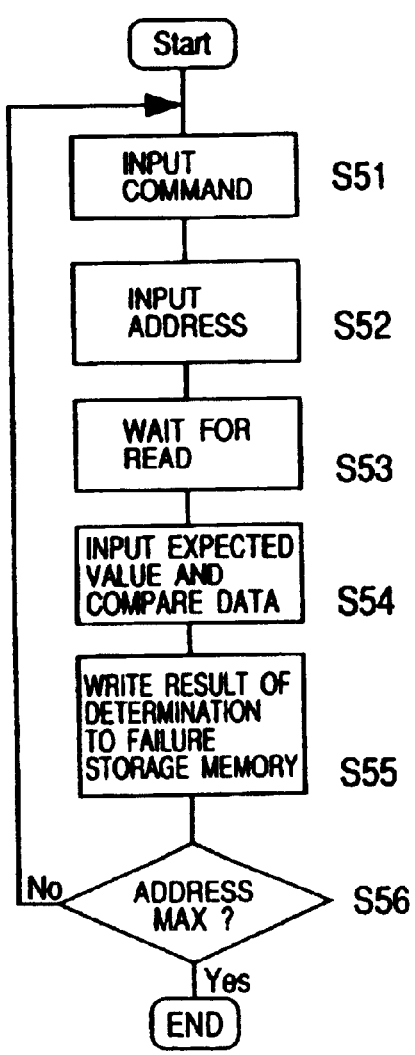
FIG. 4(A) is a flowchart illustrating a procedure for reading data from a flash memory employed as a device tested upon a burn-in test.
FIG. 4(B) is a flowchart showing a procedure for writing data into a non-defective or failure address of the tested device.
Figure 4:
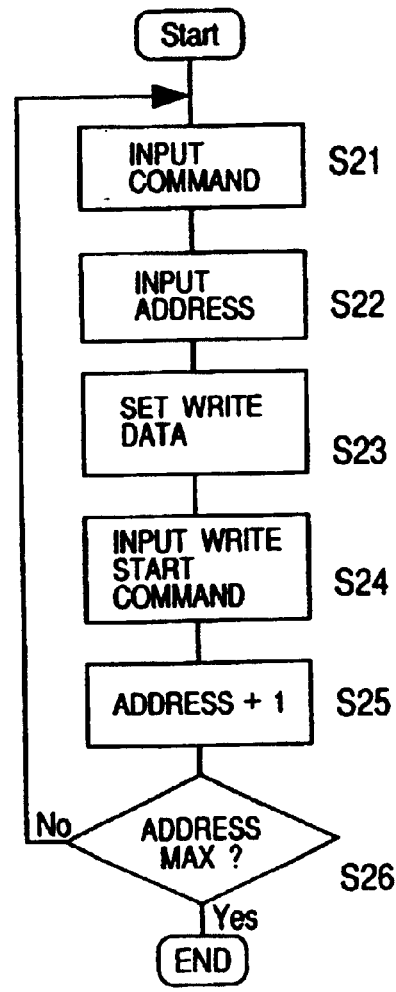

FIG. 4(A) shows a detailed operation procedure at the verify reading. Upon the read operation, a command (read command in this case) relative to the corresponding tested device is first directly supplied from the control device on the burn-in apparatus side by each of device control signals WE, CE, OE, etc. (Step S51). Next, an address ADD is inputted to the test circuit 110 (Step S52). This address ADD is supplied to the tested device 200 through the write control circuit 111 and taken in the address latch 113 lying within the test circuit 110. The address latched in the address latch 113 is supplied to the failure address storage memory 120, and a signal indicative of reading separately from the address is supplied from the control device on the burn-in apparatus side to the failure address storage memory 120.

A wait for reading of data from the tested device 200 is subsequently executed (Step S53). During this period, the data (defective or failure information) read from the failure address storage memory 120 is sent to the failure OR circuit 114. In the following Step S54, an expected value EXD is transmitted from the control device on the burn-in apparatus side, and the data read from the tested device 200 is supplied to the comparator 112, where a comparison between the expected value and the data is made. The result of comparison is outputted to the failure OR circuit 114, which in turns makes ORing with the data read from the failure address storage memory 120.

The result of this ORing is written into the same address position of the failure address storage memory 120 in the following Step S55. At this time, the control device on the burn-in apparatus side supplies a signal for instructing the failure address storage memory 120 to perform writing. During this period, the address ADD inputted in Step S52 is retained in the address latch 113. It is judged in the following Step S56 whether the input address is a final address. If it is found not to be of the final address, then the operation procedure returns to Step S51, where reading for the following address is performed. When it is determined in Step S56 that the address is of the final address, then a series of reading processes for performing erase verify are completed.

Subsequently to the erase verify, a write test based on a first pattern like, e.g., an all "1" pattern is carried out (Step S34 in FIG. 3). This write test is performed in sector units. Since a specific procedure of such a write test is substantially identical to the verify reading of FIG. 4(A), the description thereof will be omitted.

When the write test is finished, the verify reading is performed subsequently (Step S35). This reading is also carried out in sector units. However, the present verify reading may be performed after writing has ordinarily been effected on all sectors. Alternatively, the verify reading may be performed immediately after writing into each sector. The above write verify reading is also performed according to a procedure similar to the flowchart of FIG. 4(A) indicative of the read procedure for the erase verify.

Then, data read by the verify operation is compared with an expected value ("0" or "1"). When a sector having a write failure exists, a logical "1" indicative of "failure" is written into the corresponding address of the failure address storage memory 120. Incidentally, since the result of comparison by the comparator 112 and the data read from the corresponding failure address storage memory 120 are ORed by the failure OR circuit 113, the logical "1" indicative of "failure" is written into the corresponding address again as to each sector already judged as faulty in the erase verify of Step S33.

When the write test based on the pattern A and the verify reading are completed, an erase test and verify are performed again (Steps S36 and S37). Since the erase test and verify are identical to Steps S32 and S33, their detailed description will be omitted.

Thereafter, a write test based on a second pattern B like, e.g., a checker pattern different from the pattern A, and verify reading are performed (Steps S38 and S39). When a sector judged as being existent in a write failure exits, a logical "1" indicative of "failure" is written into the corresponding address of the failure address storage memory 120. Afterwards, the ease test is performed again. Thus, when write tests based on a plurality of test patterns prepared in advance, and the final erase test (Step S40) are finished, the writing of data (corresponding to data of a logical "1" when an erase state is regarded as a logical "0") into a sector of a tested device judged to be "good" is performed (Step S41). This writing into the non-failure address is automatically performed by the test circuit 110 employed in the embodiment according to a procedure indicative of a flowchart shown in FIG. 4(B).

Namely, a write command is first supplied from the control device on the burn-in apparatus side to the corresponding tested device 200 (Step S21). Next, an address ADD is inputted to the corresponding test circuit 110 (Step S22). This address ADD is supplied to the tested device 200 via the write control circuit 111 and taken or brought in the address latch 113 lying within the test circuit 110. The latched address is supplied to the failure address storage memory 120. Further, a signal for giving read instructions as distinct from the address is supplied from the control device on the burn-in apparatus side to the failure address storage memory 120.

Subsequently, the supply of write data from the control device on the burn-in apparatus side to the tested device 200 is performed (Step S23). During this period, the data (defective or failure information) read from the failure address storage memory 120 is sent to the write control circuit 111. In the following step S24, a write start command is supplied from the control device on the burn-in apparatus side to the tested device 200.

At this time, data indicative of "non-failure" or "failure" has been supplied from the failure address storage memory 120 to the writ control circuit 111 in association with the address as described above. A masking gate MSK masks write data supplied to the tested device 200 according to the data. Described specifically, when data indicative of "failure" is read from the failure address storage memory 120, the supply of write data (or address) to the tested device 200 is blocked or cut off.

Thus, when the data indicative of "failure" is read, the writing of data into the corresponding sector of the tested device 200 is prohibited. When the data indicative of "non-failure" is read, the writing of data "1" into the corresponding sector of the tested device 200 is performed. Therefore, when the data is determined by reading of data from the corresponding memory after the completion of testing, the sector can be easily judged as a normal sector if the data "1" has been written. When the read data is "0", the sector can be easily determined to be a sector including a fail bit.

The above processes (Steps S21 through S24) are repeated until the address reaches the final address while the address is being updated (+1) in Step S25. When the address is determined to be the final address in Step S26, the process of writing data into the corresponding non-failure address of the tested device is finished.

When the writing into the non-failure address in Step S41 is completed with respect to all sectors of the tested device, a process for making a decision (called "MGM determination") as to whether the number of failure addresses exceeds the number of failure addresses, which is allowable for the tested device is performed through the use of the counter 115 in the present embodiment (Step S42). In the following Step S43, a check is made as to whether the overflow signal OVF is outputted from the counter 115, to thereby make a decision as to a non-defective item or defective item.

While a nonvolatile memory such as a flash memory is normally allowed to have fail bits, substantial memory capacity is reduced when fail bits are too many, and hence it exerts an influence even on the reliability of each device. Therefore, the fail bits (the number of sectors including fail bits accurately) are normally allowable up to the allowable number. In Step S42, the number of the failure addresses stored in the failure address storage memory 120 upon the tests of Steps S32 through S40 is counted by the counter 115. Further, when the number of the failure addresses is over the allowable number, the counter 115 is operated so as to output the overflow signal OVF, so that a non-failure/failure decision as to each tested device is made.

Figure 5:
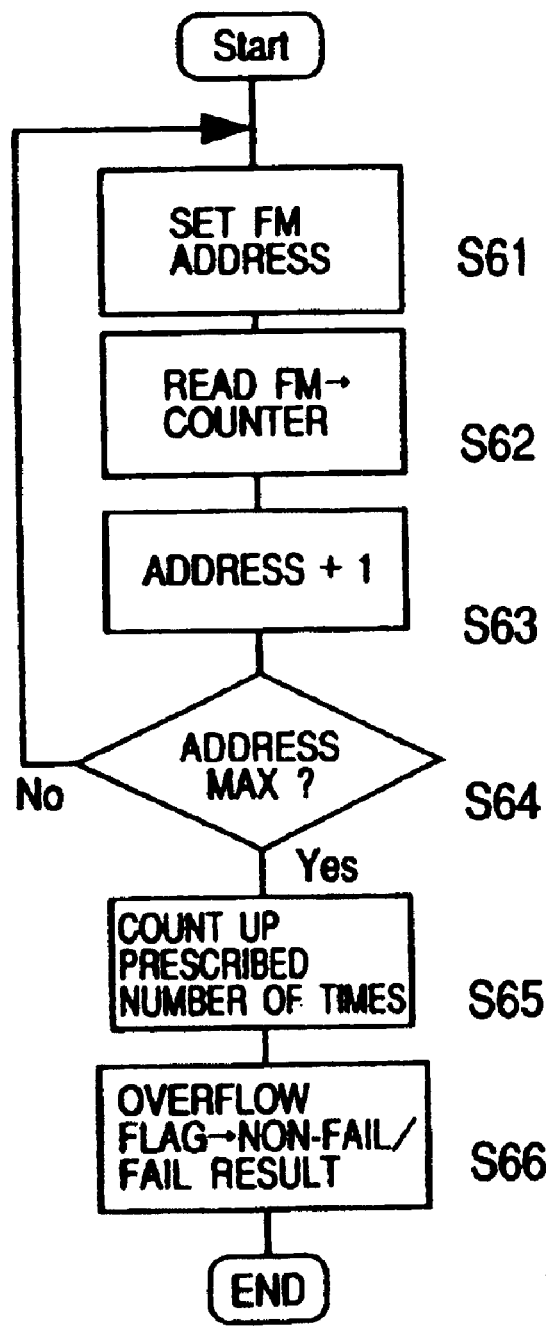
FIG. 5 is a flowchart showing a procedure for reading failure/non-failure information from a failure address storage memory upon the burn-in test and performing its counting process.

The details of the non-failure/failure procedure adopted for the present embodiment will be described below using a flowchart of FIG. 5. Incidentally, the assumption is now made that before a process to be executed according to the flowchart is started, non-failure/failure information lying within the respective tested devices in Steps S32 through S40 have been stored in the failure address storage memory 120 and the counter 115 has been cleared.

The control device of the burn-in apparatus sends a leading address for the failure address storage memory 120 to the corresponding test circuit 110 and causes the address latch 113 to latch it therein (Step S61). Next, the failure address storage memory 120 is accessed by the latched address to read the stored non-failure/failure information (Step S62). In doing so, the failure information is supplied to the counter 115. If the failure information indicates "failure", then the counter 115 is counted up. If the failure information indicates "non-failure", then the counter 115 is not counted up.

Then, the control device of the burn-in apparatus increments the address by (+1) (Step S63). It is determined whether the address has reached a maximum value, i.e., a final address of the failure address storage memory 120 (Step S64). If the address is found not to reach the final address, then the procedure returns to Step S61, where the updated address is supplied to the test circuit 110 to read the following non-failure/failure information from the failure address storage memory 120. By repeating the above operations, the counter 115 is counted up according to the non-failure/failure information. It is determined in Step S64 whether the final address is reached. When the procedure proceeds to the next Step S65, a count value of the counter 115 just coincides with the number of failure addresses (failure or bad sectors) included in the corresponding-tested device.

In Step S65, dummy failure information or determining failure information is sent from the control device of the burn-in apparatus to the counter 115 by a prescribed number to count up the counter 115. Now, the prescribed number is a value (Cmax−Pmax) obtained by, when the number of failure addresses allowable for each tested device is assumed to be Pmax, subtracting the maximum allowable number Pmax of the failure addresses from the maximum count value Cmax of the counter. If the count value of the counter 115 immediately prior to the transmission of the dummy failure information is smaller than the number Pmax of the failure addresses allowable for the tested device, then the count value of the counter 115 does not reach the maximum count value Cmax even if the dummy failure information is transmitted by the prescribed number. Therefore, no overflow signal OVF is outputted from the counter 115.

On the other hand, when the count value of the counter 115 immediately prior to the transmission of the dummy failure information is larger than the number Pmax of the failure addresses allowable for the tested device, the dummy failure information is transmitted by the prescribed number so that the count value of the counter 115 exceeds the maximum count value Cmax. Therefore, the overflow signal OVF is outputted from the counter 115. Thus, the control device on the burn-in apparatus side monitors the overflow signal OVF outputted from the counter 115 to thereby make it possible to detect whether the number of the failure addresses included in the corresponding tested device exceeds the maximum allowable number Pmax. When no overflow signal OVF is outputted even if the dummy failure information is transmitted by the prescribed number, the corresponding tested device can be judged to be a "non-defective item". When the overflow signal OVF is outputted, the corresponding tested device can be determined as a "defective item".

Incidentally, it is desirable that a memory in which data is inputted and outputted in 8-bit units, is used as a failure address storage memory, the comparator 112, the counter 115, etc. are provided by a number corresponding to the number (eight) of devices tested by one test circuit 110, and signal lines for respectively separately outputting overflow signals OVFs produced from the respective counters 115 to the control device on the burn-in apparatus side are provided on the burn-in board. Thus, even if the tested devices on the board are simultaneously tested, it is possible to easily determine which tested device is a non-defective item or which tested device is a defective item.

Figure 6:
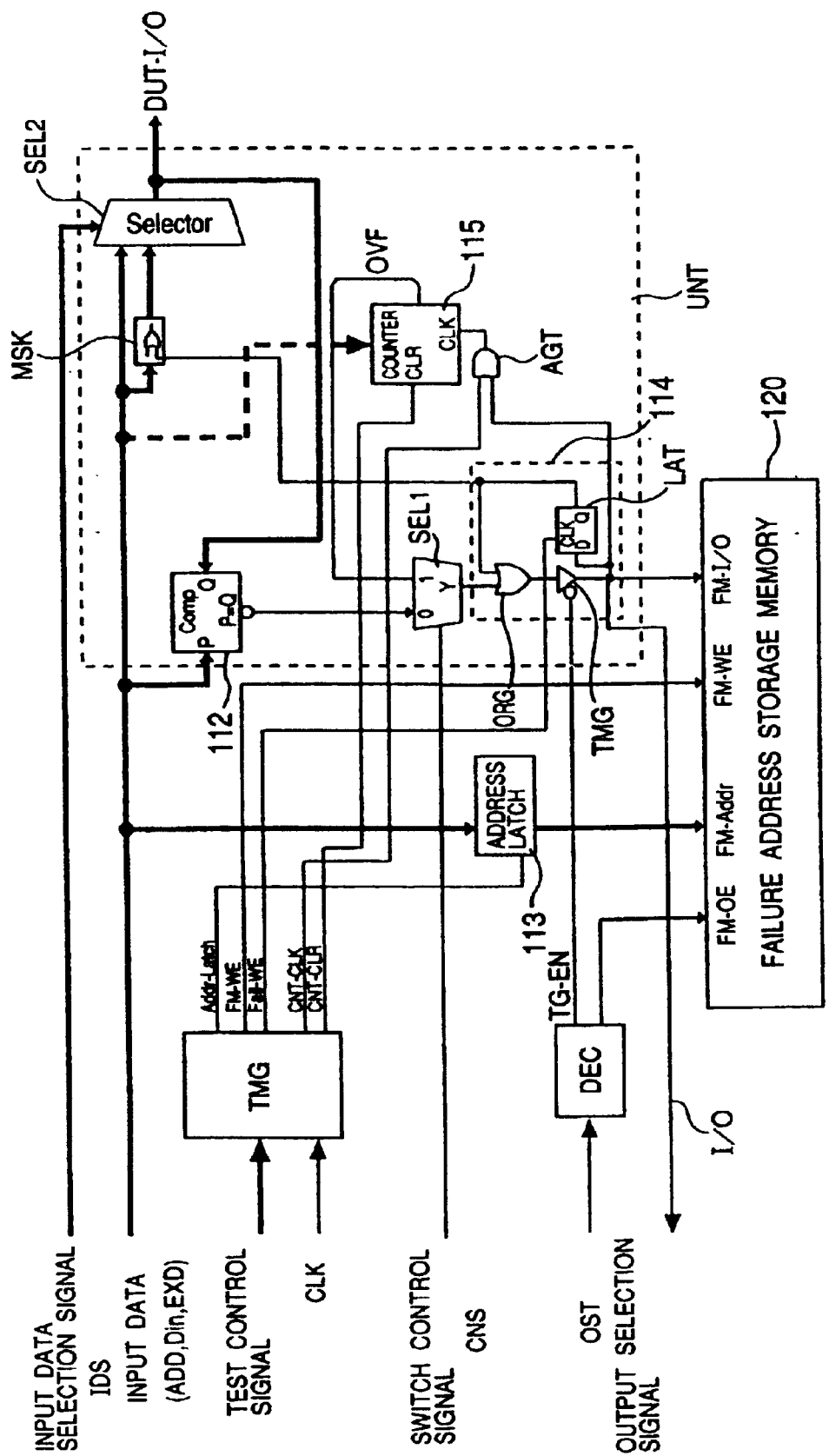
FIG. 6 is a block diagram illustrating a more specific configurational example of a test circuit.

FIG. 6 shows a more detailed configuration of the test circuit 110 shown in FIG. 2. In FIG. 6, circuit blocks each having the same function as FIG. 2 are respectively identified by the same reference numerals and the description of certain common blocks will be omitted.

As shown in FIG. 6, the failure OR circuit 114 comprises a latch LAT which latches non-failure/failure information read from the failure address storage memory 120, an OR logic gate ORG which inputs a coincidence/non-coincidence determination signal sent from the comparator 112 side, and the non-failure/failure information taken in the latch LAT and read from the failure address storage memory 120, and a transfer gate TMG which transfers the output of the OR logic gate ORG to the failure address storage memory 120 or blocks its output. A selector SEL1 for selectively supplying the output of the comparator 112 or an overflow signal OVF outputted from the counter 115 to the failure OR circuit 114 is provided between the comparator 112 and the failure OR circuit 114. The selector SELL is controlled so as to selectively output any one of the inputs in response to a switching control signal CNS supplied from the control device on the burn-in apparatus side.

Further, the embodiment shown in FIG. 6 is provided with a selector SEL2 capable of selectively supplying an address ADD and write data Din supplied from the control device on the burn-in apparatus side to the corresponding tested device, and a mask gate MSK capable of prohibiting the transfer of the address ADD and the write data Din. The address ADD and the write data Din supplied from the burn-in-apparatus side are inputted to one input terminal of the mask gate MSK. The read information (non-failure/failure information) outputted from failure address storage memory 120, which has been latched in the latch LAT in the failure OR circuit 114, is inputted to the other input terminal of the mask gate MSK, whereby the transfer of the data is prohibited or permitted according to the non-failure/failure information. The output of the mask gate MSK is inputted to a second input terminal of the selector SEL2. An input data select signal supplied from the control device on the burn-in apparatus side is applied to a control terminal of the selector SEL2.

When the address ADD is inputted from the control device on the burn-in apparatus side as input data, and the input data select signal IDS indicates an "address", the selector SEL2 selects a signal inputted to a first input terminal and outputs it to the corresponding tested device side. On the other hand, when the write data Din is inputted from the control device on the burn-in apparatus side as input data, and the input data select signal indicates "write data", the selector SEL2 selects the signal inputted to the second input terminal and outputs it to the tested device side.

Since, at this time, the mask gate MSK prohibits the transfer of data when the read information (non-failure/failure information) sent from the failure address storage memory 120, which is inputted to the other input terminal of the mask gate MSK, indicates a "failure", no write data is outputted to the tested device even if the write data is inputted from the control device on the burn-in apparatus side. Accordingly, data is written or not written into each sector lying within the tested device 200, corresponding to an address associated with the presence or absence of a failure, depending on the presence or absence of the failure. Incidentally, the mask gate MSK may prohibit the supply of an address or a command according to the non-failure/failure information as an alternative to the prohibition of the supply of the write data according to the non-failure/failure information.

Further, there are provided in FIG. 6, a timing generator TMG which generates timing signals for operating respective portions lying within the test circuit 110, based on a test control signal and a clock signal CLK supplied from the control device on the burn-in apparatus side, and a decoder DEC which decodes an output select signal OST supplied from the control device on the burn-in apparatus side to generate an output permission or enable signal FM_OE for the failure address storage memory 120 or an output permission or enable signal TG_EN for the transfer gate TMG in the failure OR circuit 114. The write control circuit 111 shown in FIG. 2 comprises the selector SEL2, mask gate MSK, timing generator TMG and decoder DEC.

In FIG. 6, the non-failure/failure information read from the failure address storage memory 120 is inputted to a clock terminal of the counter 115 through an AND logic gate AGT controlled by a timing signal CNT-CLK supplied from the timing generator TMG. A clock pulse is supplied or unsupplied to the counter 115 according to the non-failure/failure information stored in the failure address storage memory 120, where the number of failure addresses is counted. The counter 115 is configured so as to perform a count-up operation even according to dummy non-failure/failure information supplied from the control device on the burn-in apparatus side via the input/output line I/O. Incidentally, in FIG. 6, a circuit surrounded by a dashed line UNT is provided by the number of tested devices (eight) and other circuits are used as common circuits.

Figure 7:
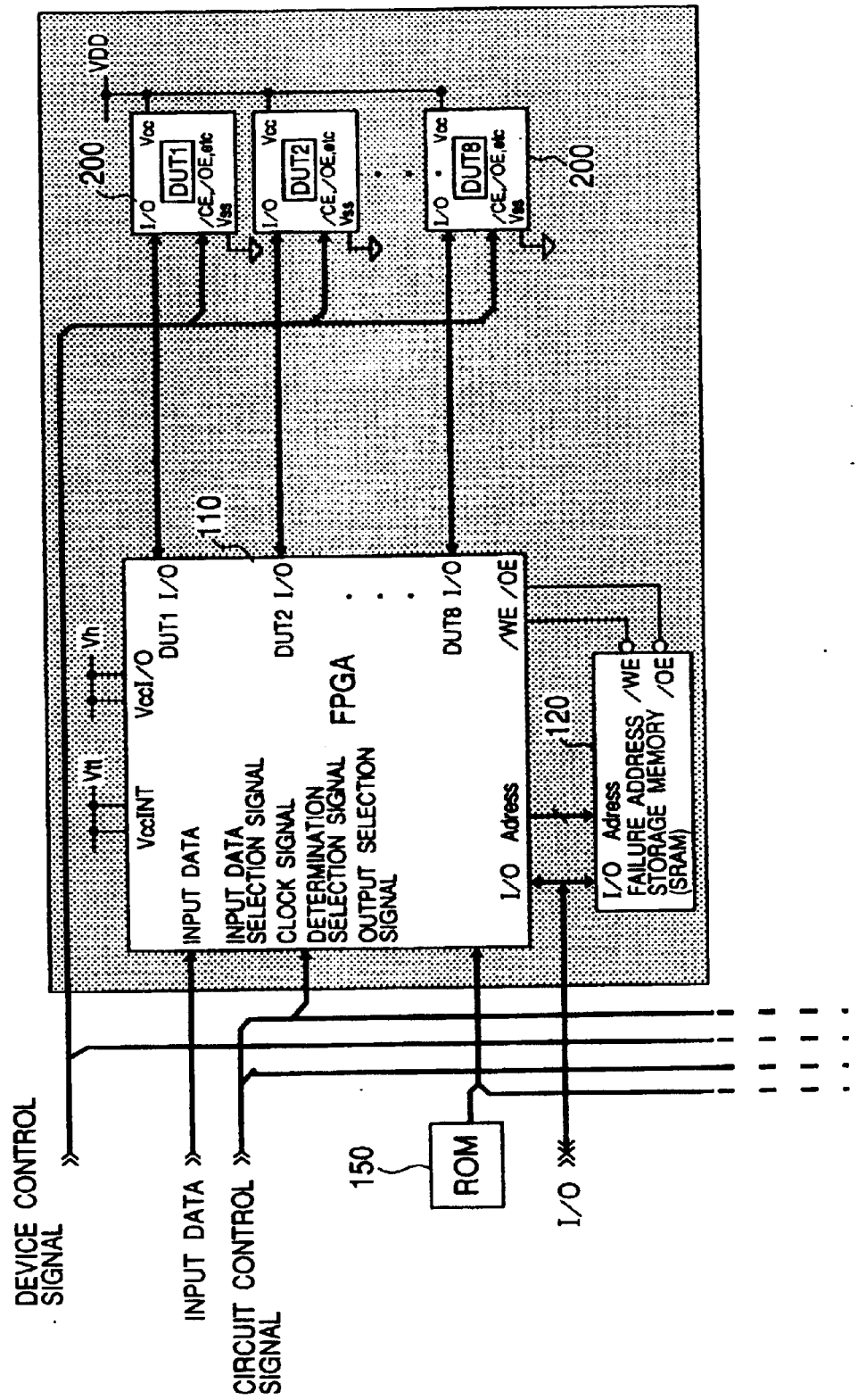
FIG. 7 is a block diagram showing an embodiment in which a test circuit is configured using an FPGA.

On the other hand, since the test circuits 110 shown in FIGS. 2 and 6 are all constituted of logic circuits, each of them can be configured using an LSI capable of constituting arbitrary logic, called an FPGA (Field Programmable Gate Array). FIG. 7 shows a system configurational example of a burn-in board where a test circuit is configured using an FPGA.

In FIG. 7, reference numeral 110 indicates a test circuit comprised of the FPGA, reference numeral 120 indicates a failure address storage memory which stores the result of failure determination, and reference numerals 200 indicate devices to be tested, respectively. In the present embodiment, comparators, counters, etc. corresponding to the eight tested devices 200 are provided within one test circuit 110. The failure address storage memory 120 is also configured so as to store failure information corresponding to the eight tested devices 200 singly. Thus, the failure address storage memory 120 may preferably make use of an SRAM capable of inputting and outputting 8-bit data simultaneously.

In FIG. 7 as well, reference numeral 150 indicates a ROM (Read Only Memory) which stores logic-configured data of the FPGA. The FPGA is configured such that a large number of variable logic cells capable of constituting arbitrary logic circuits, such as OR gates, AND gates, flip-flops, etc. are disposed inside a chip in matrix form, and is provided therearound with an orthogonal wiring group which makes it possible to connect between arbitrary variable logic cells, and a variable wiring switch group which makes it possible to connect/disconnect crossed arbitrary wirings. The ROM 150 stores information for determining the logic of each variable logic cell in the FPGA, and on and off information about variable wiring switches.

Incidentally, although not restricted in particular, the ROM 150 is provided in common with the test circuits 110 comprising a plurality (e.g., nine) of FPGAs placed on a board. Since a 1-chip LSI (Model Number: EPF10K130E) having a 130K gate scale has been provided from, e.g., Altera Corporation as the FPGA having the function referred to above, the corresponding test circuit 110 according to the embodiment can be constructed using the LSI.

Figure 8:
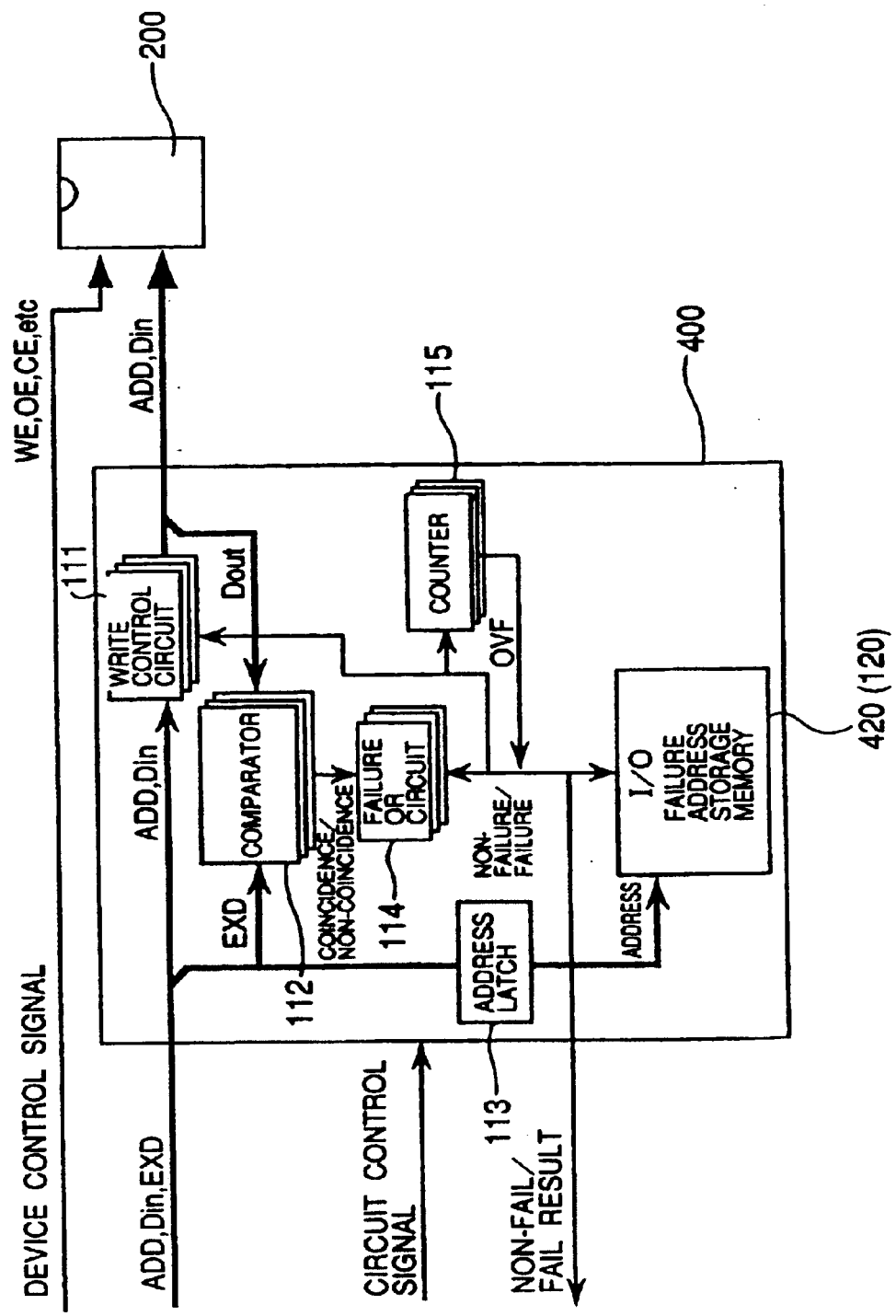
FIG. 8 is a block diagram depicting another configurational example in which a test circuit is configured using an FPGA.

On the other hand, as the FPGA, there is also provided one wherein a RAM is built in a chip. A test circuit mounted on a burn-in board may be configured using an FPGA with such a RAM built therein. FIG. 8 shows a configurational example of a test circuit using such an FPGA with the built-in RAM. In FIG. 8, designated at reference numeral 400 is an FPGA.

In the present embodiment, a RAM 420 built in the FPGA 400 is utilized as a failure address storage memory which stores failure information about a device to be tested. Since the present test circuit is similar in other configurations to the test circuit 110 according to the embodiment shown in FIG. 2, the same circuit blocks are respectively identified by the same reference numerals, and the description of certain common blocks will be omitted. Even in the present embodiment, write control circuits 111, comparators 112, failure OR circuits 114, and counters 115 are respectively provided by numbers corresponding to the number (e.g., eight) of devices to be tested by one FPGA, and other circuits are used as common circuits.

Figure 9:
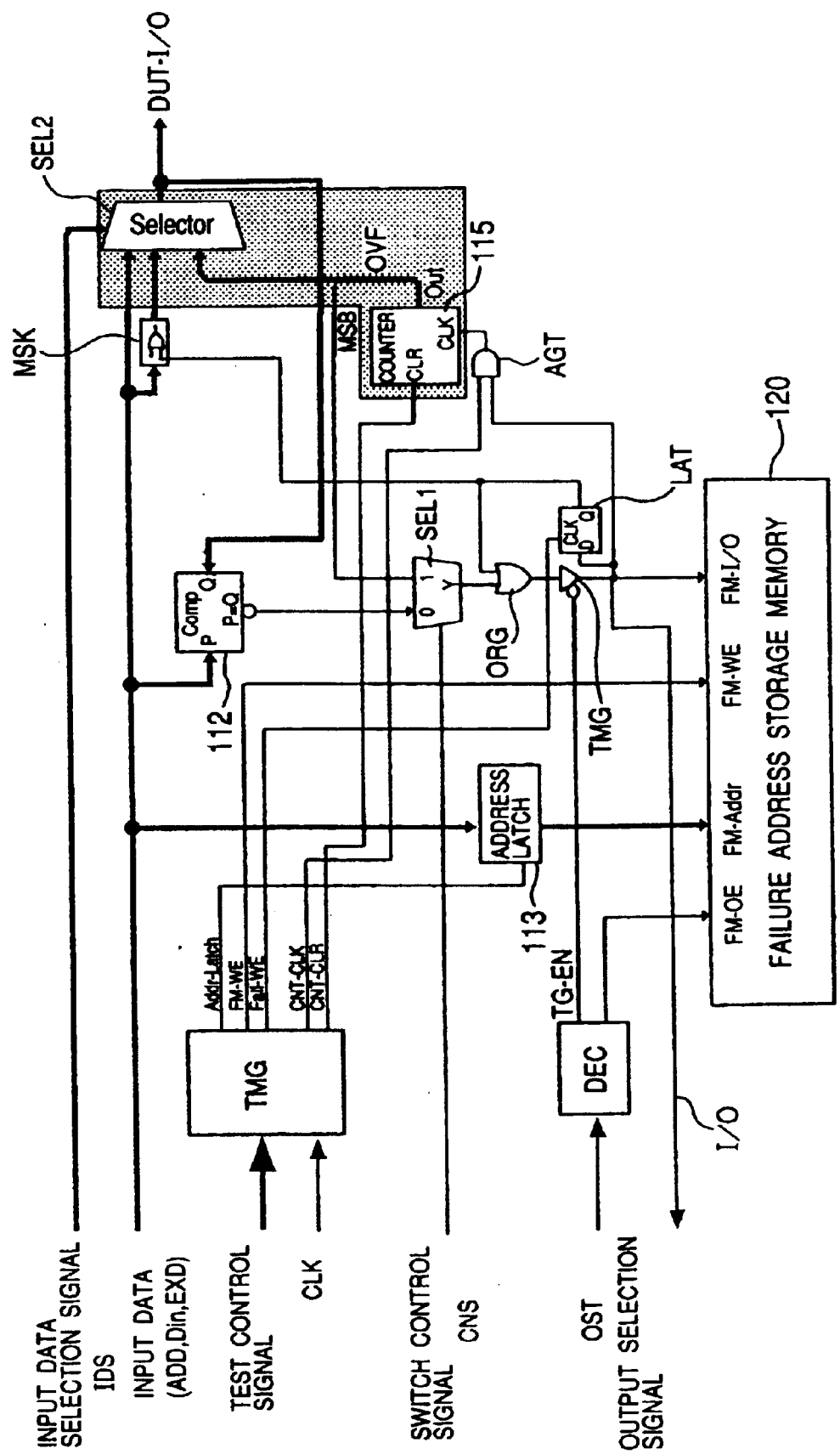
FIG. 9 is a block diagram showing another configurational example of a test circuit.

FIG. 9 shows another embodiment of a test circuit 110 provided on a burn-in board. The test circuit 110 according to the present embodiment is one configured so as to be capable of outputting an overflow signal of a counter 115 to a corresponding tested device 200 via a selector SEL2 as an alternative to the output thereof to a control device on the burn-in apparatus side. Thus, the number of failure addresses (failure or bad sectors) set every tested devices are written into flash memories as their corresponding tested devices after test completion and testing is finished. After the completion of the testing, data for the tested devices are read, and the number of sectors, i.e., the number of failure addresses in which failure information have been stored, is determined, so that a decision as to whether each product is good or bad, can be made.

In the present embodiment, the most significant bit MSB of the counter 115 can be supplied to a failure OR circuit 114 via a selector SEL1. In a manner similar to the above embodiment, a predetermined number of dummy failure signals are transmitted from the control device on the bur-in apparatus side to count up the counter 115, thereby checking for a change in the most significant bit MSB, whereby it is also possible to determine whether the number of the failure addresses (bad sectors) included in the corresponding tested device is less than or equal to the maximum allowable number.

Incidentally, an advantage is brought about in that when the test circuit 110 provided on the burn-in board is comprised of such FPGAs as shown in FIGS. 7 and 8, any change in hardware is not made, and data stored in such a logic-configured information storing ROM 300 as shown in FIG. 7 is simply rewritten, so that the test circuit having such a configuration as shown in FIG. 9 can be made up.

Figure 11:
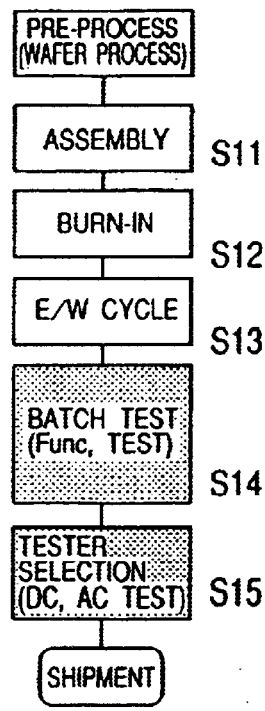
FIG. 11 is a flowchart illustrating a test procedure of a flash memory to which the present invention is applied.

A method of testing a flash memory using a burn-in board equipped with the test circuit according to the above embodiment and a process for manufacturing the same will next be described using a flowchart shown in FIG. 11.

The flash memory after the completion of an assembly step in Step S1 is shifted to a burn-in step (Step S2). In the present embodiment, several ten sheets of burn-in boards 100 equipped with 72 flash memories per sheet are inserted into their corresponding connectors lying within a heating chamber of a burn-in apparatus so that a control device on the burn-in apparatus side and test circuits on the board are electrically connected. However, the test circuit 110 is left under a high temperature (about 125° C.) for 8 to 16 hours while remaining in its deactivated state upon burn-in of Step S2. Next, a write/erase cycle test in which the control device on the burn-in apparatus side repeatedly effects writing and erasure on the corresponding tested device 200 through its corresponding test circuit 110 on the board, is executed (Step S3). While this test can be performed by the burn-in apparatus, the temperature in the chamber is set low.

In the present embodiment, a control signal is thereafter transmitted from the control device on the burn-in apparatus side to the corresponding test circuit 110 on the board, where such an erase test or a predetermined pattern-data write/read test (so-called function test) as described above is executed (Step S4). While this test takes about two hours, it may be performed without heating. Alternatively, it can also be carried out simultaneously with the burn-in process of Step S1. If the burn-in process of Step S1 and the function test of Step S3 are simultaneously performed, then a function test time interval can be set to substantially disappear.

The function test of Step S4 may be performed using a simple tester without the use of the burn-in apparatus while the corresponding tested device 200 is being mounted on the burn-in board 100 equipped with the test circuit 110. The normal memory tester is very expensive, and the function test can be executed about several ten times alone at a time. However, if the burn-in board employed in the above embodiment equipped with the test circuit is used, then the function test can be carried out using a more inexpensive simple tester without using a high-level tester. It is therefore possible to greatly reduce the cost required for testing.

Incidentally, the process proceeds to a selection step of Step S5 after the completion of the function test of Step S4, where a DC test for examining DC-based test items such as a check for a normal operation within a predetermined source voltage range, etc., and an AC test for examining an AC-based test items such as a check for a proper operation even where an input signal changes at an intended frequency, etc. are performed using a memory tester. One judged as being non-defective is selected and shipped. Since the DC test and the AC test are finished in ten minutes or so, cost performance is not so degraded even if an expensive memory tester is used.

Figure 10:
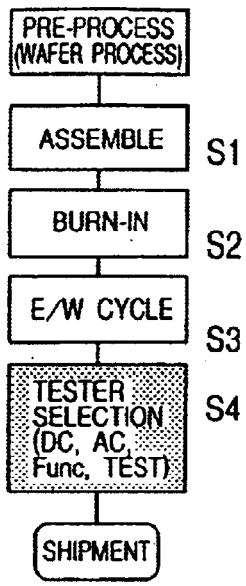
FIG. 10 is a flowchart showing a test procedure of a conventional flash memory.

In a conventional test process shown in FIG. 10, an expensive memory tester is used after a burn-in process and a function test is also performed as well as a DC test and an AC test as described in Step S14. In addition, the time required to perform such a function test was 1 to 2 hours. Therefore, test efficiency and cost performance were so degraded. However, when the present invention is applied, the batch function test may be performed by an inexpensive tester or burn-in apparatus in Step S4, whereas in the selection step of Step S5, only the DC test and AC test may be executed. It is therefore possible to greatly shorten a time interval required for testing and substantially reduce a test cost too.

Other embodiments of the present invention will next be described using FIGS. 12 and 13.

Figure 12:
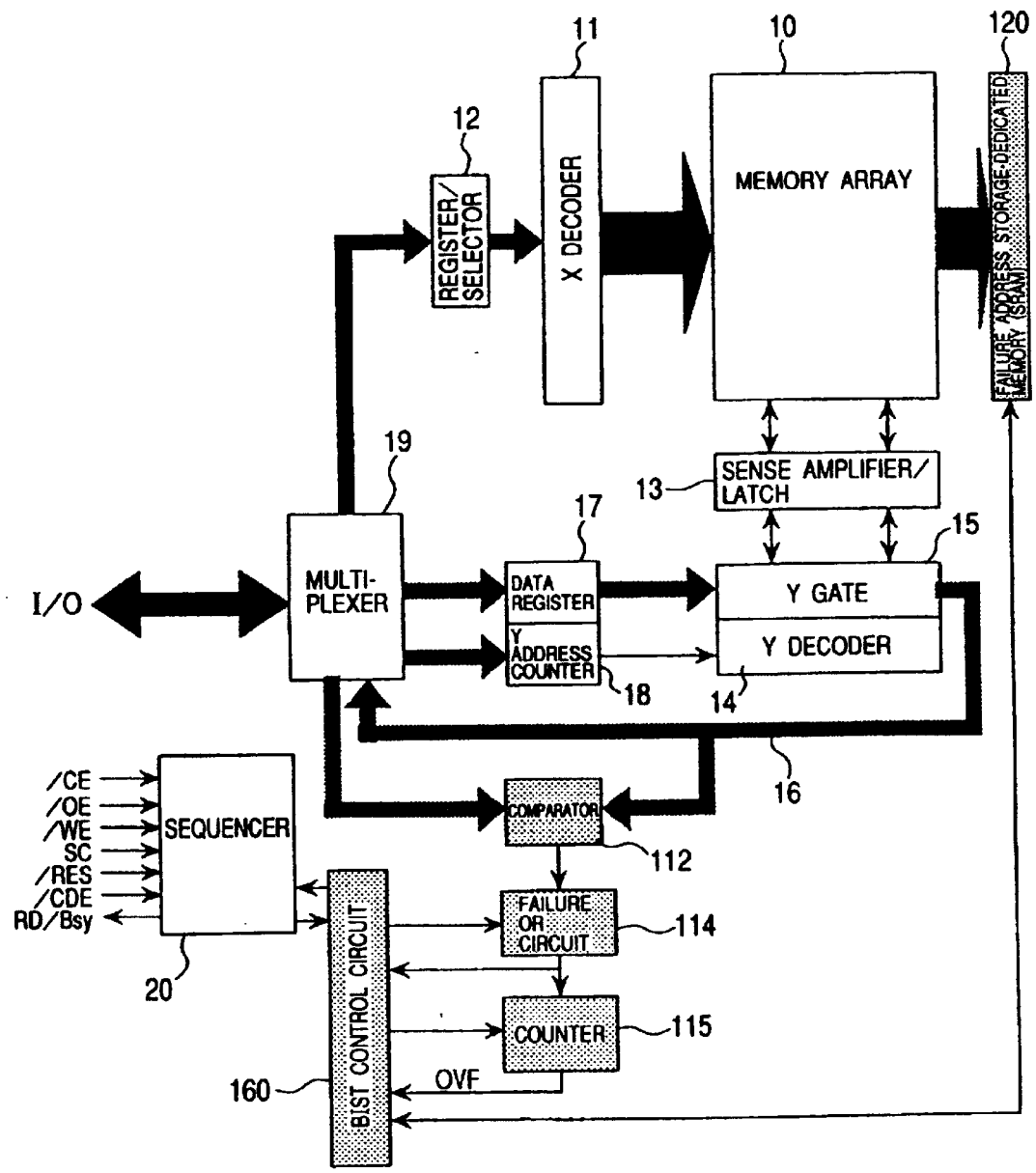
FIG. 12 is a block diagram showing a schematic configuration of a flash memory to which the present invention is applied.

The embodiment shown in FIG. 12 is one provided with a self-test circuit similar to the test circuit on the burn-in board described in the above embodiment.

In the drawing, reference numeral 10 indicates a memory array in which the known nonvolatile memory elements each comprising an MOSFET having a control gate and a floating gate are disposed in matrix form, reference numeral 11 indicates an X decoder for selecting one of a plurality of word lines connected with control gates of memory elements placed in the same row and applying a predetermined voltage thereto according to an operation mode, and reference numeral 12 indicates an address register for holding or retaining an X address (sector address) decoded by the X decoder 11, respectively. The X decoder 11 includes a word drive circuit for driving one word line in each memory mat to a select level according to the result of decoding.

Reference numeral 13 indicates a sense amplifier & data latch capable of amplifying data read from within the memory array 10 and holding, in sector units, write data written into the memory array 10, reference numeral 14 indicates a Y-system address decoder, reference numeral 15 indicates a Y gate (column switch row) for connecting the data register 13 selectively turned on and off by the Y decoder 14 to its corresponding common input/output line 16, reference numeral 17 indicates a data register which retains write data captured or brought from outside, reference numeral 18 indicates a Y address counter which generates a sequential Y address for sequentially outputting data in byte units out of read data corresponding to one sector read by the sense amplifier & data latch 13, and reference numeral 19 indicates a multiplexer for taking in addresses and data from a common input/output pin I/O on a time-division basis, respectively.

Although not restricted in particular, the flash memory according to the present embodiment is provided with a control circuit (sequencer) 20 which sequentially forms and outputs control signals for respective circuits lying inside the memory in order to interpret each command (instruction) supplied from a control device such as an external microprocessor or the like and execute a process associated with the corresponding command. The flash memory is configured so as to decode a command when the command is given and automatically execute its corresponding process. The control circuit 20 is provided with a ROM (Read Only Memory) in which a series of micro instruction groups required to execute a command, for example are stored, and is configured such that micro instructions are sequentially executed to form control signals for respective circuits lying inside a chip. Further, the control circuit 20 includes a status register which reflects its internal state.

As control signals inputted to the flash memory according to the present embodiment from an external CPU or the like, may be mentioned, for example, a reset signal RES, a chip select signal CE, a write control signal WE, an output control signal OE, a command enable signal CDE for indicating the input of data or the input of each address, a serial clock SC for giving a data take-in or fetch timing, etc. Further, the flash memory according to the present embodiment is configured so as to output a ready/busy signal R/B indicative of whether accessing is allowed from outside, to the outside according to predetermined bits of the status register which reflects the internal state of the memory.

The flash memory according to the present embodiment is provided with a comparator 112 which compares 1-byte data read from the memory array 10 and selected by the Y gate 15 with expected-value data inputted from outside, a failure OR circuit 114 which takes ORing of the result of comparison with the result of coincidence/non-coincidence of previous read data, a counter 115 which counts the number of failure addresses, a failure address storage memory 120 which comprises an SRAM or the like and stores therein non-failure/failure information detected by a test, and a BIST (Build In Self Test) control circuit 160 which controls test operations in the chip.

A specific configuration of the failure OR circuit 114 is similar to that described in the embodiment of FIG. 6. A procedure and contents of a test by the comparator 112, failure OR circuit 114, counter 115, and failure address storage memory 120 are also substantially similar to ones described in the embodiments of FIGS. 2 and 6. The points of difference therebetween reside in that the flash memory according to the present embodiment is configured in such a manner that word lines for the failure address storage memory 120 are simultaneously selected by their corresponding select signals of the X decoder 11 for the memory array 10, and the result of failure determination by a test circuit is stored in a storage or memory region in the failure address storage memory 120 corresponding to each memory row of the memory array 10, and also configured such that addresses at a write test and verify are directly supplied to the memory array 10 from outside through the input/output pin I/O.

However, such a write control circuit 111 (input mask circuit MSK, selector SEL2, timing generator TMG and decoder DEC) as shown in the embodiment of FIG. 2 (FIG. 6) may be provided within the chip as part of a test circuit. As an alternative to the input of testing addresses and data from outside, the above ALPG for generating the testing addresses and data in accordance with the predetermined algorithm is provided inside the chip, and the memory array 10 may be tested according to the testing addresses and data generated in the ALPG.

In a manner similar to the above control circuit 20, the BIST control circuit 160 employed in the present embodiment is provided with a ROM in which a series of micro instruction groups necessary to execute each command, for example, have been stored. The BIST control circuit 160 can be comprised of a control circuit of a microprogram control system, which sequentially executes micro instructions to form control signals for respective circuits lying inside the chip. A command for effecting a test start on the BIST control circuit 160 is configured so as to be supplied from the control circuit 20.

Since commands are originally prepared for the flash memory for the purpose of its self test, such a flash memory is capable of giving a test start command from an external device through the use of a self-test starting command. A memory free of such a command is also configured such that non-used combinations of the external control signals such as the write control signal WE, the output control signal OE, etc. are used and a data input/output terminal is used to enable the input of each command code, thus making it possible to give a test start command to the BIST control circuit 160. The BIST control circuit 160 and the control circuit 20 of the flash memory may be formed integrally.

Further, there can also be provided a dedicated interface for the BIST control circuit 160. In such a case, a TAP (Test Access Port) defined by the IEEE1149.1 standard can be utilized. The TAP comprises a bypass register used upon shifting test data from an input port to an output port with an interface and a control circuit for a scan test and a BIST circuit defined by the IEEE1149.1 standard, a data register used when a specific signal is transmitted to the corresponding circuit, a device ID register for setting a manufacture identification number inherent in the chip, an instruction register used upon controlling the selection of the data register and an internal test method, a controller for controlling the entire TAP circuit, etc. Owing to the setting of the TAP as the interface, the number of electrode pads for connecting to the external device for the purpose of data rewriting may be several.

Incidentally, although not shown in FIG. 12, the flash memory according to the present embodiment is provided with an internal power circuit which generates a high voltage used for writing or erasure, an input buffer circuit which takes in or captures each command inputted from outside, an output buffer circuit for outputting a data signal read from the memory array and the contents of an internal register to the outside, an input buffer circuit which takes in an address signal and a write data signal inputted from outside, etc.

Figure 13:
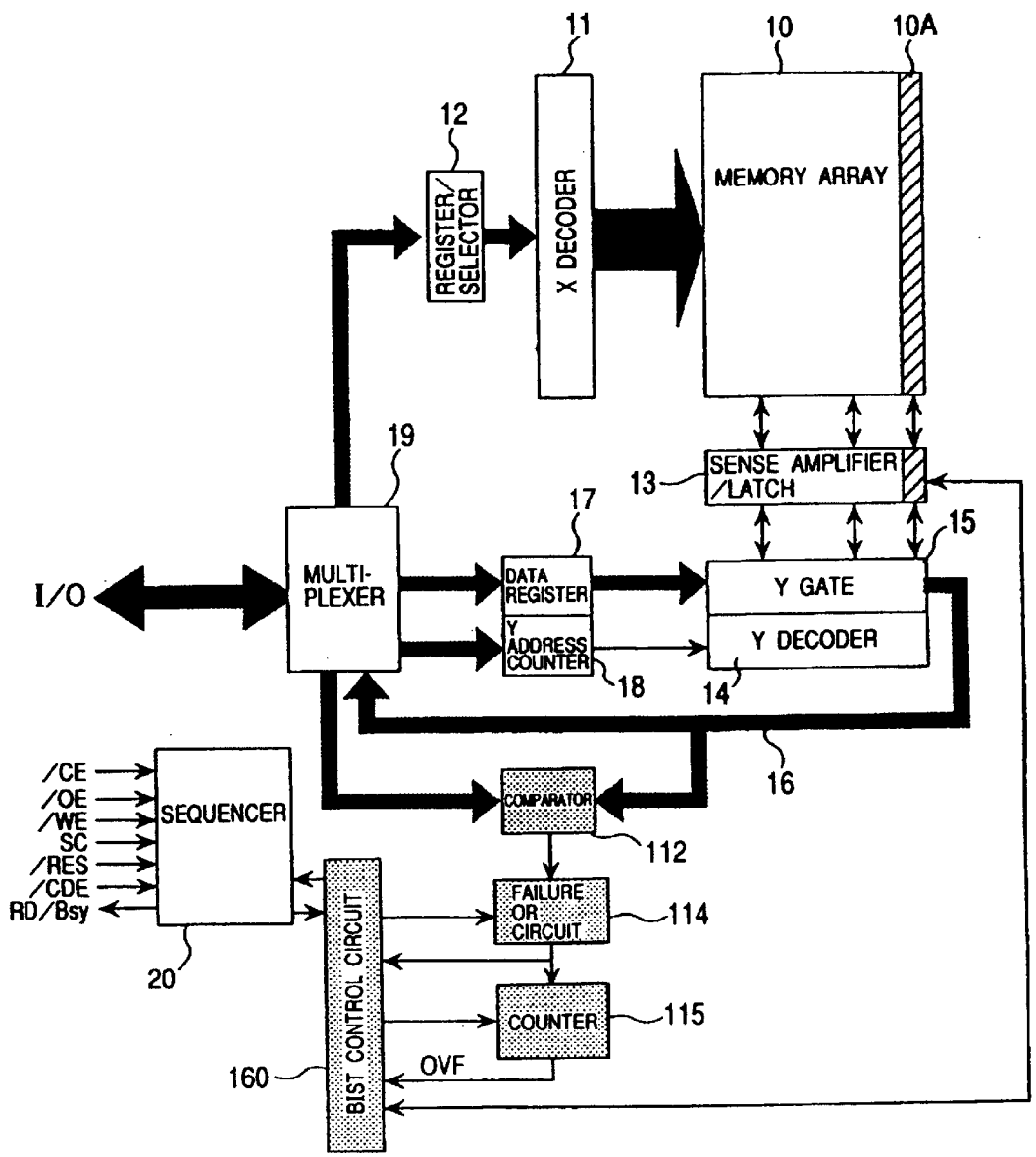
FIG. 13 is a block diagram depicting another embodiment of a flash memory to which the present invention is applied.

In a manner similar to the embodiment of FIG. 12, the embodiment shown in FIG. 13 is one in which a self-test circuit similar to the test circuit on the burn-in board described in the above embodiment is provided within the flash memory. The difference between the embodiment shown in FIG. 12 and the embodiment shown in FIG. 13 resides in that the information about each failure address obtained by the test is stored in the SRAM in the embodiment shown in FIG. 12, whereas in the embodiment shown in FIG. 13, part of a memory array 10 comprising nonvolatile storage elements is used as a non-failure/failure information storage area. Since one originally provided with an area (e.g., 64 bytes) for storing sector management information for each sector of the memory array is known as the flash memory, the flash memory can be configured so as to store non-failure/failure information in such a sector management area 10A.

In the flash memories shown in FIGS. 12 and 13, a function test including a write test for writing data into the corresponding memory array while updating at least each address can be performed without using a memory tester having a high function. The function test can be carried out within the burn-in apparatus according to the input of each signal from the control device of the burn-in apparatus. Further, the function test can also be performed using a simple test device other than the burn-in apparatus.

Incidentally, while the flash memory has been described as a binary memory for causing one memory cell to store 1-bit data, i.e., a memory for causing one memory cell to store either a logical "1" or a logical "0" in the present specification, the present invention is not limited to it. In a high-capacity flash memory, the development of a multi-valued technology for causing one memory cell to store data of 2 bits to a plurality of bits has been actively performed in recent years. It is needless to say that the present invention can be applied even to such a multi-valued memory.

While the invention developed above by the present inventors has been described specifically based on the illustrated embodiments, the present invention is not limited to the embodiments. It is needless to say that various changes can be made thereto within the scope not departing from the substance thereof. While, for example, the above embodiment has described, as on example, a case in which the test circuit provided on the burn-in board is configured using the FPGA, the test circuit can be also configured using a gate array or an ASIC (special-purpose IC) as an alternative to the FPGA.

In the above embodiment, the failure address storage memory 120 is configured such that the sector for each tested device 200 and its corresponding address of the failure address storage memory 120 are in a one-to-one correspondence with each other. Further, the failure address storage memory 120 is configured so as to store information indicative of non-failure/failure therein in association with the corresponding sector. However, the failure address storage memory 120 may be configured so as to store an address indicative of a failure or bad sector. Alternatively, the failure address storage memory 120 may store failures in word, byte or bit units other than in sector units.

INDUSTRIAL APPLICABILITY

While the above description has principally been made of, as an example, the test of the flash memory which belongs to the field of application corresponding to the background of the invention, the present invention is not necessarily limited to it. The present invention can be used even in the test of a nonvolatile memory other than the flash memory, a volatile memory such as a RAM or the like, and a semiconductor integrated circuit with those built therein.

What is claimed is:

1. A semiconductor memory comprising:
a memory circuit; and
a testing circuit including a comparator for comparing data read from the memory circuit with expected value data to thereby detect coincidences/non-coincidences therebetween and a counter for counting the number of the detected non-coincidences, said memory circuit, said testing circuit, and a result-of-determination storage circuit storing a result of failure determination based on a result of comparison by the comparator being formed over the same semiconductor chip,
wherein the memory circuit is tested by the testing circuit while addresses are being updated, the number of addresses at which failures are detected, is configured so as to be counted by the counter, and information obtained by ORing a previous result of failure determination read from the result-of-determination storage circuit with a result of failure/non-failure determination based on the result of comparison by the comparator is configured so as to be stored in the result-of-determination storage circuit.

2. The semiconductor memory according to claim 1, wherein the result of counting by the counter is configured so as to be capable of being outputted to the outside.

3. The semiconductor memory according to claim 1, wherein each of word lines for the result-of-determination storage circuit is selected by a select signal of an address decoder for selecting each word line in a memory array of the memory circuit, and the result of failure determination based on the result of comparison by the comparator is configured so as to be stored in the result-of-determination storage circuit in association with each memory row of the memory circuit to be tested.

4. The semiconductor memory according to claim 1, wherein the result-of-determination storage circuit is provided at part of the memory circuit to be tested.

5. The semiconductor memory according to claim 1, wherein the counter is configured so as to count the failure information read from the result-of-determination storage circuit.

6. The semiconductor memory according to claim 1, wherein the counter is configured so as to count the failure information read from the result-of-determination storage circuit and output an overflow signal when the counter counts subsequently-inputted determining failure information and counts the same up to a predetermined number.

7. The semiconductor memory according to claim 1, wherein the memory circuit to be tested comprises nonvolatile memory elements, and the result-of-determination storage circuit is constituted of volatile memory elements.

* * * * *